US007018729B2

(12) United States Patent
Pocker et al.

(10) Patent No.: US 7,018,729 B2
(45) Date of Patent: Mar. 28, 2006

(54) ENERGY GRADIENT ION BEAM DEPOSITION OF CARBON OVERCOATS ON RIGID DISK MEDIA FOR MAGNETIC RECORDINGS

(75) Inventors: Daryl J. Pocker, San Jose, CA (US); Jan-Ulrich Thiele, Menlo Park, CA (US); Richard L. White, Los Altos, CA (US); Bing K. Yen, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 263 days.

(21) Appl. No.: 10/611,240

(22) Filed: Jun. 30, 2003

(65) Prior Publication Data
US 2004/0265640 A1    Dec. 30, 2004

Related U.S. Application Data

(62) Division of application No. 09/721,264, filed on Nov. 21, 2000, now Pat. No. 6,902,773.

(51) Int. Cl.
*G11B 5/72* (2006.01)

(52) U.S. Cl. .................................. 428/835; 428/835.4

(58) Field of Classification Search ......... 428/694 TC, 428/336, 835, 835.4
See application file for complete search history.

(56) References Cited

U.S. PATENT DOCUMENTS

| 5,227,211 A | 7/1993 | Eltoukhy et al. ............. 428/64 |
|---|---|---|
| 5,232,570 A | 8/1993 | Haines et al. .......... 204/192.16 |
| 5,540,957 A | 7/1996 | Ueda et al. .................. 427/535 |
| 5,567,512 A | 10/1996 | Chen et al. .................. 428/332 |
| 5,589,263 A | 12/1996 | Ueda et al. .................. 428/336 |
| 5,637,393 A | 6/1997 | Ueda et al. .................. 428/332 |
| 5,679,431 A | 10/1997 | Chen et al. ................. 428/65.3 |
| 5,773,124 A * | 6/1998 | Ishikawa et al. ............ 428/141 |
| 5,776,602 A | 7/1998 | Ueda et al. .................. 428/332 |
| 5,785,825 A | 7/1998 | Hwang et al. ......... 204/192.16 |
| 5,798,135 A | 8/1998 | Ueda et al. .................. 427/130 |
| 5,837,357 A | 11/1998 | Matsuo et al. .............. 428/212 |
| 5,858,477 A * | 1/1999 | Veerasamy et al. ......... 427/562 |
| 6,086,730 A * | 7/2000 | Liu et al. ............... 204/192.16 |
| 6,303,214 B1 * | 10/2001 | Chour et al. ................. 428/212 |
| 6,312,798 B1 * | 11/2001 | Ma et al. ..................... 428/336 |

FOREIGN PATENT DOCUMENTS

JP    09288818    11/1997

* cited by examiner

*Primary Examiner*—Stevan A. Resan
(74) *Attorney, Agent, or Firm*—Robert O. Guillot; Intellectual Property Law Offices

(57) ABSTRACT

The fabrication of the overcoat layer starts with a low energy ion beam to avoid magnetic layer implantation problems, followed by higher deposition energies where the higher energy atoms are implanted into the previously formed lower energy overcoat layer, rather than the magnetic layer. The energy gradient ion beam deposition process therefore results in a thin overcoat layer that is denser than a comparable layer formed by low energy magnetron sputtering, and which overcoat layer provides good mechanical and corrosion protection to the magnetic layer, without degrading the magnetic properties of the magnetic layer.

12 Claims, 2 Drawing Sheets

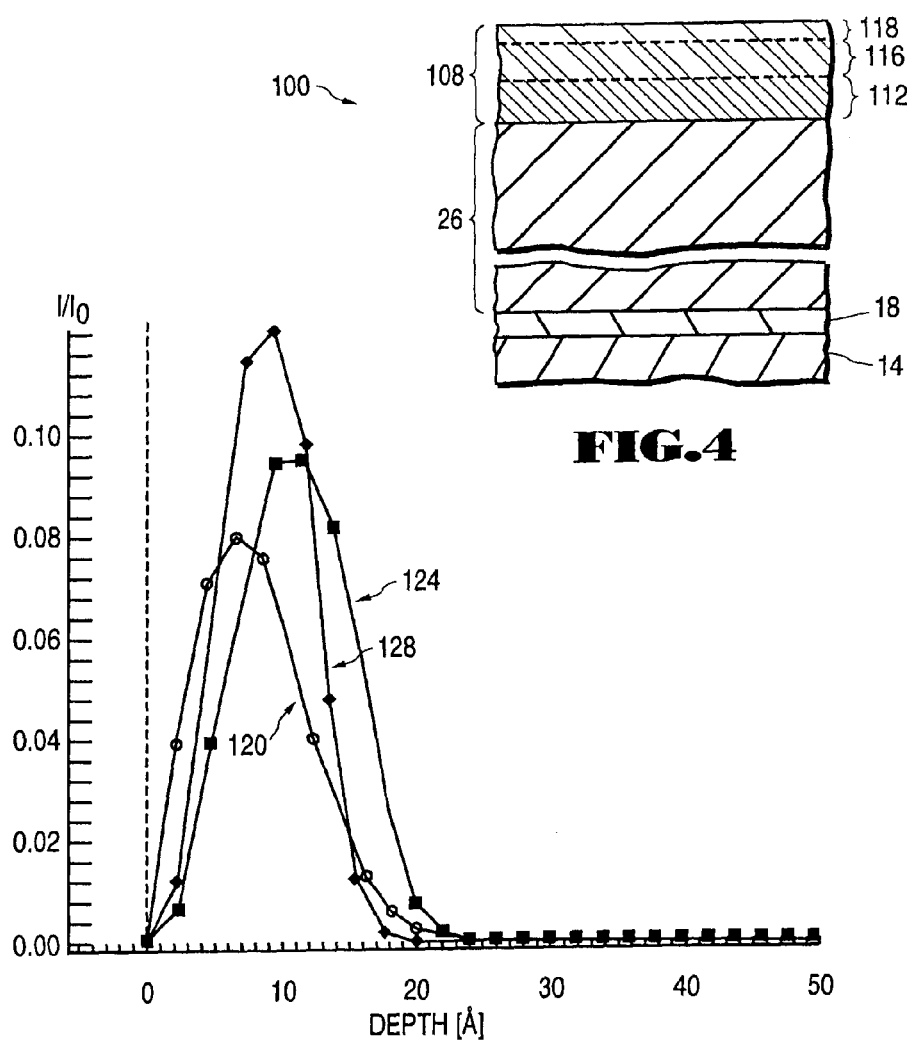
FIG. 4
FIG. 5
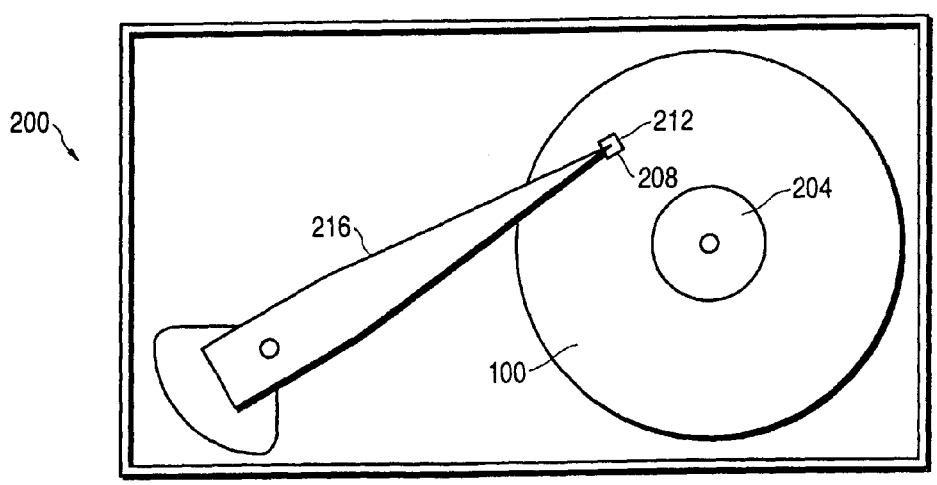
FIG. 6

ENERGY GRADIENT ION BEAM DEPOSITION OF CARBON OVERCOATS ON RIGID DISK MEDIA FOR MAGNETIC RECORDINGS

This application is a divisional of U.S. patent application Ser. No. 09/721,264 filed Nov. 21, 2000, U.S. Pat. No. 6,902,773.

BACKGROUND OF THE INVENTION

1. Field of the Invention

The present invention relates generally to protective layers fabricated upon magnetic layers of hard disk media, and more particularly to thin film diamond-like carbon protective layers.

2. Description of the Prior Art

Standard magnetic media hard disks include a magnetic layer that is covered by a protective overcoat layer. The overcoat layer is necessary to provide both mechanical and corrosion protection for the magnetic layer, and typical prior art overcoat layers are composed of a hard, carbon based composition that is applied by a magnetron sputtering technique to a thickness of approximately 50 to 200 Å.

The ongoing efforts to increase the areal data storage density of magnetic disks have resulted in a need to reduce the thickness of the overcoat layer while increasing the hardness, or density of the overcoat layer. It has been found that a typical magnetron sputtered overcoat of below approximately 50 Å is not sufficiently hard, nor does it provide sufficient corrosion protection to the magnetic layer, due to the generally low energy (approximately 10 eV) at which the carbon atoms are deposited. Efforts to create a thin, hard, corrosion resistant overcoat have therefore been directed towards fabrication devices such as mass selected ion beam deposition (MSIB), cathodic arc, laser plasma deposition and plasma enhanced chemical vapor deposition (PECVD) which produce carbon atom deposition energies of 100 eV or more. While such 100 eV deposited overcoat layers provide good mechanical and corrosion resistance properties, they also create deterioration problems for the underlying magnetic layer. Specifically, at such high energies, the carbon atoms, as well as other atoms such as nitrogen and hydrogen that are often utilized in forming the overcoat layer, become implanted into the magnetic layer to a significant depth. The implanted atoms can seriously degrade the magnetic properties of the magnetic layer within its upper regions, thus resulting in degraded performance of a magnetic disk that is fabricated with an overcoat layer formed with prior art high energy carbon deposition techniques.

The present invention solves these prior art problems through the use of an energy gradient ion beam deposition technique in which the implanting of carbon overcoat ions into the magnetic layer is reduced.

SUMMARY OF THE INVENTION

In the energy gradient ion beam deposition technique of the present invention, the fabrication of the overcoat layer starts with a low energy ion beam to avoid magnetic layer implantation problems, followed by higher deposition energies where the higher energy atoms are implanted into the previously formed lower energy overcoat layer, rather than the magnetic layer. The energy gradient ion beam deposition process therefore results in a thin overcoat layer that is denser than a comparable layer formed by low energy magnetron sputtering, and which overcoat layer provides good mechanical and corrosion protection to the magnetic layer, without degrading the magnetic properties of the magnetic layer. Where a magnetic media hard disk of the present invention is utilized within a hard disk drive, the thinner overcoat layer allows the magnetic head of the disk drive to fly closer to the magnetic media layer, thereby facilitating an increase in the areal data storage density of the hard disk drive.

It is an advantage of the magnetic media hard disk of the present invention that it is fabricated with a thinner overcoat layer.

It is another advantage of the magnetic media hard disk of the present invention that it is fabricated with a denser overcoat layer.

It is a further advantage of the magnetic media hard disk of the present invention that it is fabricated with a thinner, denser effective overcoat layer wherein minimal implantation of carbon ions into the magnetic media layer is found.

It is yet another advantage of the magnetic media hard disk of the present invention that it is fabricated with a thinner effective overcoat layer such that a greater areal data storage density can be created with said disk.

It is an advantage of the magnetic media hard disk drive of the present invention that it includes one or more magnetic media hard disks of the present invention wherein the data storage within said disk drive is increased.

It is another advantage of the hard disk drive of the present invention that it includes one or more magnetic disks of the present invention having a thinner effective overcoat layer, such that the areal data storage density of said hard disk drive may be increased.

It is an advantage of the fabrication process for a magnetic media hard disk of the present invention that a thinner, denser overcoat layer is fabricated with minimal carbon ion implantation into a magnetic media layer of the hard disk.

It is another advantage of the fabrication process for a magnetic media hard disk of the present invention that controlled deposition of nitrogen ion species into the overcoat layer may be accomplished.

These and other features and advantages of the present invention will no doubt become apparent to those skilled in the art upon reading the following detailed description which makes reference to the several figures of the drawings.

IN THE DRAWINGS

FIG. 4 is a side cross-sectional view depicting a magnetic disk having an overcoat layer that is fabricated utilizing the energy gradient ion beam deposition technique of the present invention;

FIG. 5 is a graphical representation of the implantation of 100 eV carbon ions into 20 Å carbon surface layers having different densities; and FIG. 6 is a schematic top plan view of a hard disk drive including the magnetic disk of the present invention.

DETAILED DESCRIPTION OF THE PREFERRED EMBODIMENTS

Figure 1:
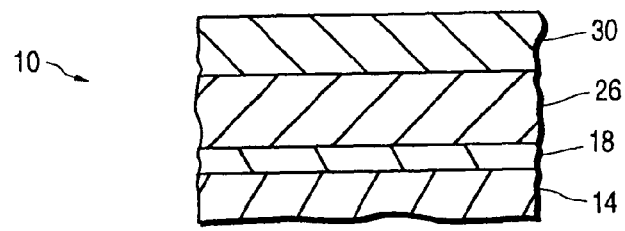
FIG. 1 is a side cross-sectional view depicting a prior art overcoat layer formed by magnetron sputtering fabrication techniques.

As is well known to those skilled in the art, a thin film overcoat layer is fabricated upon the magnetic layer of a magnetic media hard disk to provide mechanical and corrosion protection to the magnetic layer. FIG. 1 is a side cross-sectional view of a typical prior art magnetic media hard disk 10 having such an overcoat. As depicted in FIG. 1, the prior art hard disk 10 includes a disk substrate 14 that typically has a plurality of thin film layers deposited thereon. While various types of prior art hard disks exist, with various numbers and compositions of thin film layers, for the purposes of this disclosure, a typical prior art hard disk 10 can be said to include a at least one underlayer 18 formed upon the surface of the substrate 14, a magnetic layer 26 formed upon the underlayer 18, and an overcoat layer 30 formed upon the magnetic layer 26. As indicated above, the present invention is directed to the features and relationships between the magnetic layer 26 and the overcoat layer 30. In a typical prior art hard disk 10, the magnetic layer 26 is composed of a magnetic material, usually having a CoPtCr composition, that has a thickness of approximately 50 to 200 Å. The overcoat layer 30 is composed of diamond-like carbon (DLC) and is applied utilizing a magnetron sputtering technique having a relatively low application energy that is less than or equal to approximately 10 eV, and the DLC layer 30 is deposited to a thickness of at least approximately 50 Å to 200 Å. It is significant that there is very little implantation of the sputtered carbon ions of the overcoat layer 30 into the magnetic layer 26, due to the low ion energy level of the overcoat layer fabrication technique.

To increase the hard disk data areal storage density, it is desirable to write magnetic data bits closer together in the data track; that is, to increase the number of bits per inch (BPI). To accomplish this, it is desirable to have the magnetic write head positioned closer to the magnetic layer, and decreasing the thickness of the overcoat layer 30 is advantageous in this regard. However, it has been found that if the thickness of the prior art low energy magnetron sputtered overcoat layer 30 is reduced to below approximately 50 Å, both the mechanical protection and corrosion protection of the magnetic layer is 25 adversely affected. A prior art approach to resolve this problem is to apply the overcoat layer 30 utilizing a higher energy ion beam fabrication technique, such that a denser overcoat layer is fabricated than is achieved in the low energy magnetron sputtering process. Where the overcoat layer is denser, a thinner layer will provide suitable mechanical and corrosion protection to the magnetic layer, and a magnetic hard disk 50 with such a prior art high deposition energy DLC overcoat layer is depicted in FIG. 2.

Figure 2:
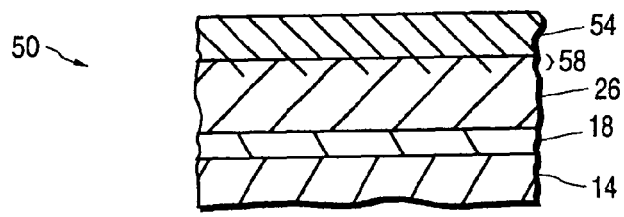
FIG. 2 is a side cross-sectional view of a prior art magnetic disk including an overcoat layer that is formed utilizing high energy carbon ion beam fabrication techniques.

As depicted in FIG. 2, the prior art magnetic hard disk 50 includes a substrate 14 upon which an underlayer 18 has been deposited, followed by a 200 Å thick magnetic layer 26. The layers 14, 18 and 26 may be identical to those described above with regard to prior art hard disk 10, whereby identical identification numbers are used herein. A DLC overcoat layer 54 that is fabricated in a high energy fabrication process such as mass selected ion beam deposition (MSIB), cathodic arc, laser plasma deposition and plasma enhanced chemical vapor deposition (PECVD) is formed upon the magnetic layer 26. It has been observed that some of the high energy carbon ions that form the overcoat layer 54 penetrate into the magnetic layer 26, forming an ion implanted upper portion 58 of the magnetic layer of approximately 10 Å to 20 Å, as shown by the cross hatched portion 58 of the magnetic layer 26.

Figure 3:
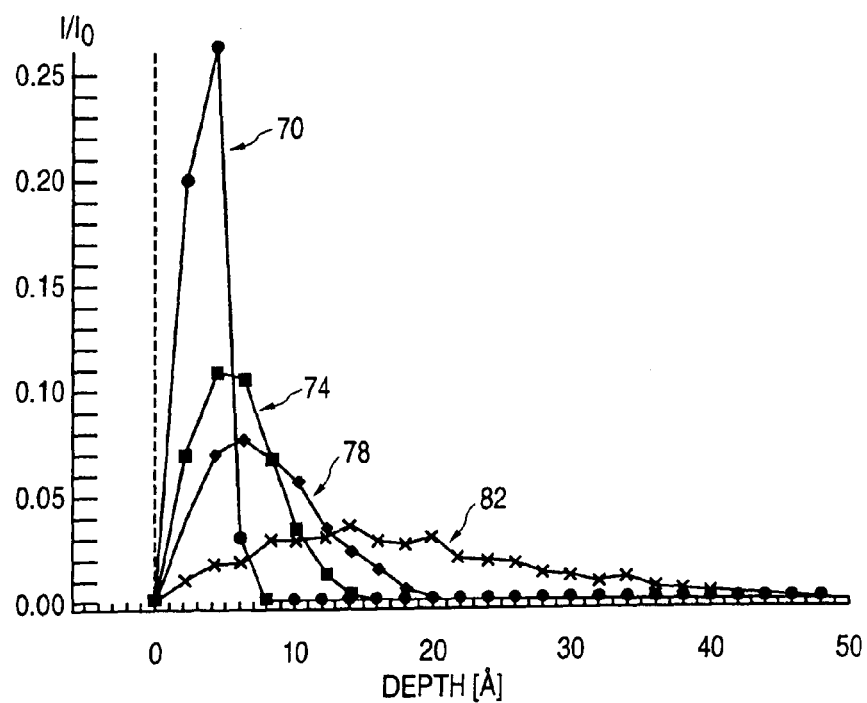
FIG. 3 is a graphical representation of the implantation of carbon ions of various energy levels into a magnetic layer.

A graphical representation of the implantation of carbon ions of various energy levels into a magnetic layer is presented in FIG. 3. More specifically, FIG. 3 depicts an implantation profile 70 for 10 eV carbon ions, wherein the vertical axis ($I/I_0$) represents the quantity of carbon ions and the horizontal axis represents the implantation depth of the carbon ions from the surface (zero) into the magnetic media layer which is composed of a CoPtCr alloy. In like manner, graphical profile 74 represents 50 eV carbon ions, graphical profile 78 represents 100 eV carbon ions and graphical profile 82 represents 500 eV carbon ions. As is seen in FIG. 3, the great majority of 10 eV carbon ions 70 are deposited within the first 5 Å, and nearly all of the 10 eV carbon ions are deposited within the first 8 Å of the magnetic layer. With regard to 100 eV carbon ions 78, a significant portion thereof are deposited in excess of 10 Å. Thus, the crosshatched portion 58 of magnetic layer 26 of FIG. 2 may be generally as deep as 20 Å for the 100 eV carbon ions.

Significantly, the implanted carbon ions influence the magnetic properties of the magnetic layer portion 58 and degrade its performance. The degraded performance of the ion implanted upper portion 58 of the magnetic layer can be quite significant with regard to overall disk performance, because the upper portion 58 of the magnetic layer 26 contributes significantly to the performance characteristics of magnetic data bits that are written into the magnetic layer. Therefore, the high energy overcoat layer 54 is thinner than the prior art low energy magnetron sputtered layer 30, while still providing good hardness and corrosion resistance; but the magnetic performance properties of the hard disk 50 are somewhat degraded due to the implantation of carbon overcoat layer ions into the magnetic layer 26. The present invention provides an improvement in the prior art overcoat layer technologies by utilizing an ion deposition beam having an energy gradient, such that carbon ion implantation into the magnetic layer is minimized, while the desired thinness and density of the DLC overcoat layer are achieved.

As depicted in FIG. 4, a magnetic media hard disk 100 of the present invention generally includes the substrate 14, underlayer 18 and magnetic layer 26, as are generally known in the prior art and described hereabove with regard to FIGS. 1 and 2 above, and a DLC overcoat layer 108 of the present invention that is fabricated on top of the magnetic layer 26. In that the present invention relates generally to the DLC overcoat layer 108, magnetic media hard disks having other, different and additional layers fabricated beneath the magnetic layer 26, as well as various magnetic layer compositions are intended to be included within the scope of the present invention.

As has been indicated above, the overcoat layer 108 of the present invention is thinner and denser than the low energy magnetron sputtered layer 30, and it is fabricated such that carbon ion implantation into the magnetic layer 26 is minimized. To accomplish this, the overcoat layer 108 is fabricated utilizing a device that produces an ion beam that has an ion deposition energy gradient. Specifically, the fabrication of the overcoat layer 108 is commenced with the deposition of an initial overcoat layer portion 112 with a low energy ion beam, such as from approximately 10 to approximately 20 eV, which is generally the energy level of the low energy magnetron sputtering process of the prior art, as depicted in FIG. 1. Thereafter, as the deposition of the initial overcoat layer portion 112 progresses, the overcoat layer 112 increases in thickness upon the surface of the magnetic layer 26, and due to the relatively low deposition beam energy level, implantation of overcoat layer ions into the magnetic layer 26 is minimized. After the initial overcoat layer thickness is deposited at the low energy level, the energy level of the beam is increased to deposit an intermediate overcoat layer portion 116. The higher energy ions will penetrate more deeply into the surface layer, as has been described hereabove with regard to prior art disk 50; however, because the initial surface layer 112 has been formed of overcoat material, the higher energy overcoat ions penetrate only into the pre-existing initial overcoat layer portion 112. Thus, as the build up of the intermediate overcoat layer portion 116 progresses, the total overcoat layer generally both becomes thicker with overcoat ions that remain on its surface, as well as denser with higher energy overcoat ions that become implanted within the thickness of the initial overcoat layer. Thereafter, a subsequent overcoat layer portion 118 may be deposited with a still higher ion beam energy level. Again, these higher energy overcoat ions penetrate into the surface of the overcoat layer 108. However, due to the thickness of the existing overcoat layer the high energy ions become implanted into both the initial and intermediate overcoat layer portions and do not penetrate into the magnetic layer 26. A typical DLC overcoat layer density of the present invention is between approximately 2.0 g/cm$^3$ to approximately 2.9 g/cm$^3$.

FIG. 5 is a graphical representation of 100 eV carbon ion implantation into a magnetic disk having surface layers deposited thereon. Specifically, the graphical profile 120 represents the implantation of 100 eV carbon ions into a CoPtCr magnetic layer having no surface layer deposited thereon, and it can be seen that profile 120 is substantially identical to profile 78 of FIG. 3. Profile 124 represents the 100 eV carbon ion implantation into a 20 Å aC:H surface layer having a density of 1.7 grams/centimeter. It can be seen that the great majority of the 100 eV carbon ions are deposited within the 20 Å depth of the surface layer. Graphical profile 128 represents the implantation of 100 eV carbon ions into a 20 Å IBD-C surface layer having a density of 2.2 grams/centimeter, wherein it is seen that nearly all of the 100 eV carbon ions are implanted within the 20 Å IBD-C surface layer. It is therefore to be understood from the graphical representations of FIG. 5 that a sufficiently dense surface layer will prevent the implantation of 100 eV carbon ions into the magnetic layer of a hard disk.

It is therefore to be generally understood that the energy gradient of the ion beam is to be controlled in association with the thickness of the overcoat layer that is being fabricated, such that the highest beam energy levels are utilized when the thickness of the overcoat layer is close to its desired thickness. In this ion beam energy gradient fabrication process the higher energy ions become predominantly implanted into the pre-existing overcoat layer portion, thereby increasing its density, hardness and corrosion resistance, without adding significantly to its thickness, and implantation of ions into the magnetic layer is minimized. Additionally, it is known that the addition of nitrogen ions into the DLC layer can have a positive effect upon its hardness and corrosion resistance. However, nitrogen ions can also create significant problems if they become implanted into the magnetic layer. Therefore, in an alternative preferred embodiment of the present invention, the initial lower energy overcoat layer fabrication is conducted without nitrogen ions. Thereafter, when an initial low energy overcoat layer has been deposited, nitrogen ions are then included within the higher energy ion beam, to also become implanted within the overcoat layer, rather than into the magnetic layer. A nitrogen enhanced DLC layer is thereby produced in which nitrogen ion implantation into the magnetic layer is minimized.

The present invention has been implemented in a Circulus magnetic media hard disk fabrication device. In this device, the DLC overcoat layer is applied onto the magnetic layer of hard disks utilizing a radio frequency (RF) discharge chamber, which creates an overcoat ion plasma from a gaseous source. In this device, a deposition rate of approximately 10 Å per second is achieved with appropriate input gas concentrations and other control parameters as are well known to those skilled in the art.

To create a DLC overcoat layer of the present invention, acetylene gas was utilized as the carbon ion source. The chamber control parameters were set such that the acetylene gas produced a carbon ion plasma that was directed to the magnetic layer of a hard disk disposed within the chamber. The disk was exposed to an ion beam energy of approximately 10 eV for approximately one second, resulting in an initial carbon overcoat layer having a thickness of approximately 10 Å. Thereafter, the ion beam energy level was increased to approximately 50 eV and the disk was exposed for an additional one second to add an intermediate overcoat layer portion 116, to create an overcoat layer having a thickness of approximately 19 Å. Thereafter, the ion beam energy was increased to approximately 100 eV, and the disk was exposed to the ion beam for approximately one second, to produce a subsequent overcoat layer portion 118, such that the total overcoat layer 108 has a thickness of approximately 25 Å. In an enhanced overcoat layer deposition process, nitrogen gas can be mixed with the acetylene gas in the second and third deposition energy level steps to create nitrogen ions that are implanted into the overcoat layer. The concentration of nitrogen can be increased as the energy level is increased to create a nitrogen enhanced overcoat layer. A preferred concentration range of nitrogen ions within the overcoat layer is from approximately 2 at. % to approximately 20 at. %.

While the example provided hereabove demonstrates the use of a three step (10 eV, 50 eV, 100 eV) ion beam energy gradient, it is to be understood that the present invention can be practiced utilizing a two step gradient, a multiple step gradient, and a smooth energy gradient. Additionally, ion beam energy levels in excess of 100 eV are contemplated, although there appears to be little advantage to ion beam energy levels in excess of approximately 100 eV. A general principal of the present invention is that the thickness of the DLC layer formed at lower energy levels be sufficient to capture the carbon and nitrogen ions that become implanted at higher energy levels. With the use of appropriate process parameters such as deposition rates and times, as will be understood by those skilled in the art after having read this disclosure, the thickness and density of the overcoat layer can be controlled. Preferred embodiments of the present invention have an overcoat thickness of from approximately 25 Å to approximately 100 Å, with a more preferred upper thickness range of approximately 60 Å, and with a more preferred thickness of approximately 35 Å; the density of the overcoat is between approximately 2.0 g/cm$^3$ to 2.9 g/cm$^3$, and the optional nitrogen concentration is from 2 at. % to 20 at. %

The magnetic disk of the present invention is designed for installation in a hard disk drive, and FIG. 6 is a schematic top plan view of a hard disk drive 200 which includes at least one, and typically a plurality, of magnetic disks 100 of the present invention. As depicted therein, at least one magnetic head disk 100 is rotatably mounted upon a motorized spindle 204. A slider 208, having a magnetic head 212 disposed thereon, is mounted upon an actuator arm 216 to fly above the surface of each rotating hard disk 100, as is well known to those skilled in the art. The hard disk drive 200 of the present invention thus includes improved features and manufacturing methods for the magnetic disk 100 as have been described hereabove.

While the present invention has been shown and described with reference to certain preferred embodiments, it is to be understood that those skilled in the art will no doubt devise certain alterations and modifications thereto which nevertheless include the true spirit and scope of the present invention. It is therefore intended that the following claims cover all such alterations and modifications in form and detail that nevertheless include the true spirit and scope of the present invention.

What we claim is:

1. A magnetic media hard disk, comprising:
   a substrate;
   a magnetic layer;
   at least one underlayer being disposed between said substrate and said magnetic layer;
   an overcoat layer being disposed above said magnetic layer, said overcoat layer being comprised of diamond-like carbon (DLC), and wherein carbon atoms of said DLC layer are implanted into said magnetic layer to a depth of less than approximately 10 Å, and wherein the density of said overcoat layer is between approximately 2.0 g/cm$^3$ and approximately 2.9 g/cm$^3$.

2. A magnetic disk as described in claim 1 wherein the thickness of said overcoat layer is from approximately 25 Å to approximately 100 Å.

3. A magnetic disk as described in claim 1 wherein the thickness of said overcoat layer is from approximately 25 Å to approximately 60 Å.

4. A magnetic disk as described in claim 1 wherein the thickness of said overcoat layer is approximately 35 Å.

5. A magnetic disk as described in claim 1 wherein said overcoat layer includes nitrogen.

6. A magnetic disk as described in claim 5 wherein said overcoat layer includes nitrogen in the range of approximately 2 at. % to approximately 20 at. %.

7. A hard disk drive, comprising:
   at least one magnetic media hard disk being adapted for rotary motion upon a disk drive motor spindle;
   at least one slider device having a slider body portion being adapted to fly over said magnetic media hard disk;
   a magnetic head being formed on said slider body for writing data to said magnetic media hard disk and reading data from said magnetic media hard disk;
   said magnetic media hard disk, including:
   a substrate;
   a magnetic layer;
   at least one underlayer being disposed between said substrate and said magnetic layer;
   an overcoat layer being disposed above said magnetic layer, said overcoat layer being comprised of diamond-like carbon (DLC), and wherein carbon atoms of said DLC layer are implanted into said magnetic layer to a depth of less than approximately 10 Å, and wherein the density of said overcoat layer is between approximately 2.0 g/cm$^3$ and approximately 2.9 g/cm$^3$.

8. A hard disk drive as described in claim 7 wherein the thickness of said overcoat layer is from approximately 25 Å to approximately 100 Å.

9. A hard disk drive as described in claim 7 wherein the thickness of said overcoat layer is from approximately 25 Å to approximately 60 Å.

10. A hard disk drive as described in claim 7 wherein the thickness of said overcoat layer is approximately 35 Å.

11. A hard disk drive as described in claim 7 wherein said overcoat layer includes nitrogen.

12. A hard disk drive as described in claim 11 wherein said overcoat layer includes nitrogen in the range of approximately 2 at. % to approximately 20 at. %.

* * * * *